US008921196B2

(12) United States Patent
Pellizzer et al.

(10) Patent No.: US 8,921,196 B2
(45) Date of Patent: Dec. 30, 2014

(54) DOUBLE PATTERNING METHOD FOR CREATING A REGULAR ARRAY OF PILLARS WITH DUAL SHALLOW TRENCH ISOLATION

(75) Inventors: Fabio Pellizzer, Cornate d'Adda (IT); Marcello Mariani, Milan (IT); Giorgio Servalli, Ciserano (IT)

(73) Assignee: Micron Technology, Inc., Boise, ID (US)

( * ) Notice: Subject to any disclaimer, the term of this patent is extended or adjusted under 35 U.S.C. 154(b) by 263 days.

(21) Appl. No.: 13/132,602

(22) PCT Filed: Dec. 30, 2008

(86) PCT No.: PCT/IT2008/000813
§ 371 (c)(1),
(2), (4) Date: Jun. 2, 2011

(87) PCT Pub. No.: WO2010/076825
PCT Pub. Date: Jul. 8, 2010

(65) Prior Publication Data
US 2011/0248382 A1 Oct. 13, 2011

(51) Int. Cl.
*H01L 27/102* (2006.01)
*H01L 27/24* (2006.01)
*H01L 21/033* (2006.01)
*H01L 45/00* (2006.01)

(52) U.S. Cl.
CPC ......... *H01L 27/1022* (2013.01); *H01L 21/0338* (2013.01); *H01L 27/2463* (2013.01); *H01L 45/1233* (2013.01); *H01L 27/2445* (2013.01); *H01L 45/144* (2013.01); *H01L 45/126* (2013.01); *H01L 45/06* (2013.01)
USPC ............................ 438/360; 438/342; 438/329

(58) Field of Classification Search
CPC .................................................... H01L 21/0338
USPC .................................. 438/342, 329, 349, 360
See application file for complete search history.

(56) References Cited

U.S. PATENT DOCUMENTS

| 5,328,810 | A   | * | 7/1994  | Lowrey et al. | 430/313 |
|-----------|-----|---|---------|---------------|---------|
| 6,077,745 | A   | * | 6/2000  | Burns et al.  | 438/270 |
| 6,225,165 | B1  | * | 5/2001  | Noble et al.  | 438/268 |
| 7,847,374 | B1  | * | 12/2010 | Wang          | 257/560 |
| 2006/0186483 | A1 | * | 8/2006 | Cho et al.    | 257/390 |
| 2007/0048674 | A1 | * | 3/2007 | Wells         | 430/313 |

* cited by examiner

*Primary Examiner* — Allen Parker
(74) *Attorney, Agent, or Firm* — Schwegman Lundberg & Woessner, P.A.

(57) ABSTRACT

A method is disclosed for forming vertical bipolar junction transistors including a regular array of base contact pillars and emitter contact pillars with a width below the minimum lithographical resolution F of the lithographic technique employed. In an embodiment, the pillar array features have a dimension of approximately F/2, though this dimension could be reduced down to other values compatible with embodiments of the invention. A storage element, such as a phase change storage element, can be formed above the regular array of base contact pillars and emitter contact pillars.

14 Claims, 14 Drawing Sheets

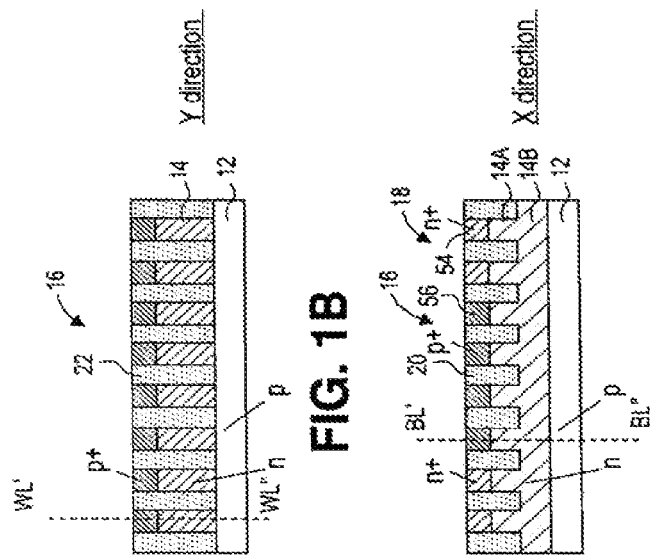
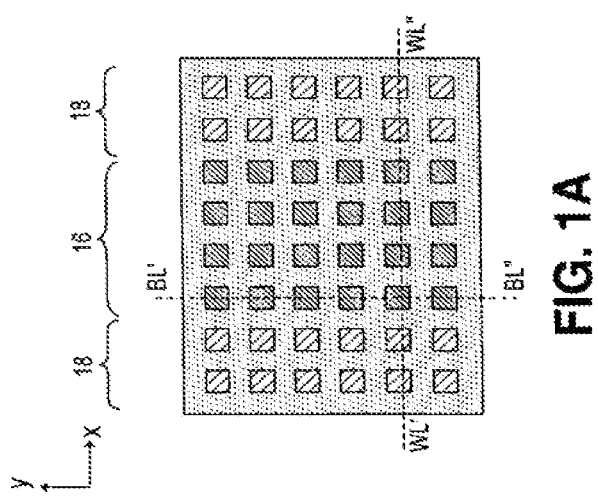

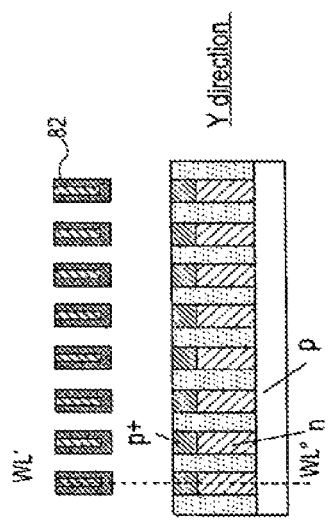
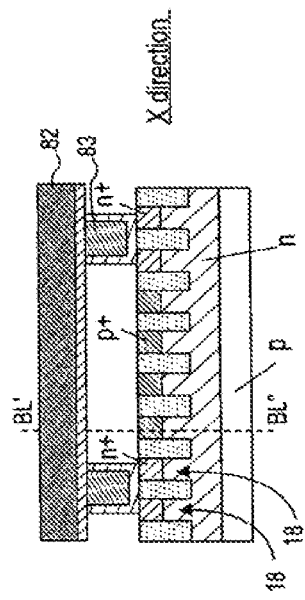
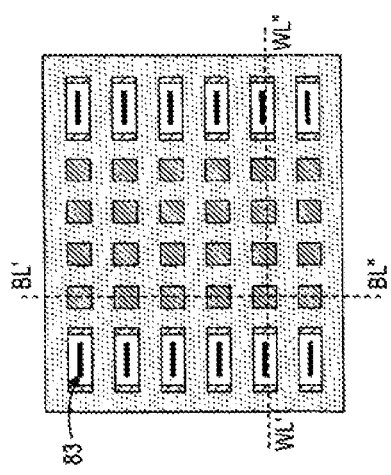
FIG. 24B
FIG. 24C
FIG. 24A

US 8,921,196 B2

DOUBLE PATTERNING METHOD FOR CREATING A REGULAR ARRAY OF PILLARS WITH DUAL SHALLOW TRENCH ISOLATION

CROSS REFERENCE TO RELATED APPLICATION

This patent application is a U.S. National Phase application under 35 U.S.C. §371 of International Application No. PCT/IT2008/000813, filed on Dec. 30, 2008, entitled DOUBLE PATTERNING METHOD FOR CREATING A REGULAR ARRAY OF PILLARS WITH DUAL SHALLOW TRENCH ISOLATION.

BACKGROUND

Embodiments of the invention relate to a method of fabricating a regular array of vertical bipolar junction transistors with dimensions below the minimum lithographical resolution. In particular, the present description refers to the manufacture of a regular array of vertical bipolar junction transistors operating as selection devices in a phase change memory.

Phase change memories are formed by memory cells connected at the intersections of bit-lines and word-lines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change materials is non-volatile, absent application of excess temperatures, such as those in excess of 150° C., for extended times. When the memory is set in either a crystalline, semi-crystalline, amorphous, or semi-amorphous state representing a resistance value, that value is retained until reprogrammed, even if power is removed.

Selection elements may be formed according to different technologies. For example, they can be implemented by diodes, metal oxide semiconductor (MOS) transistors or bipolar transistors.

BRIEF DESCRIPTION OF THE DRAWINGS

FIG. 1A is a top view illustration of a regular array of pillars in accordance with an embodiment.

FIG. 1B is a side view illustration along the BL'-BL" line in FIG. 1A.

FIG. 1C is a side view illustration along the WL'-WL" line in FIG. 1A.

FIG. 24A is a top view illustration of a plug landing on base contact pillars.

FIG. 24B is a side view illustration along the BL'-BL" line in FIG. 24A.

FIG. 24C is a side view illustration along the WL'-WL" line in FIG. 24A.

DETAILED DESCRIPTION

Figure 2:
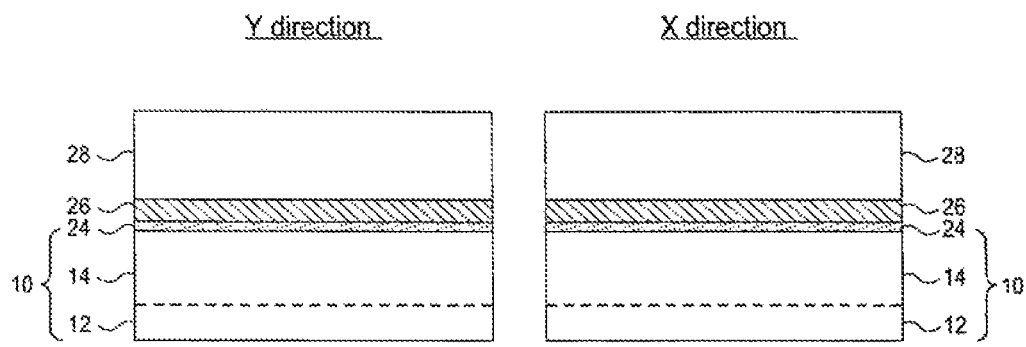
FIG. 2-FIG. 23 are side view illustrations of an embodiment for fabricating the structure illustrated in FIG. 1A-FIG. 1C.

Embodiments of the present invention disclose a method of fabricating a regular array of vertical bipolar junction transistors with dimensions below the minimum lithographical resolution.

Various embodiments described herein are described with reference to figures. However, certain embodiments may be practiced without one or more of these specific details, or in combination with other known methods and configurations. Reference throughout this specification to "one embodiment" or "an embodiment" means that a particular feature, configuration, composition, or characteristic described in connection with the embodiment is included in at least one embodiment of the invention. Thus, the appearances of the phrase "in one embodiment" or "an embodiment" in various places throughout this specification are not necessarily referring to the same embodiment of the invention. Furthermore, the particular features, configurations, compositions, or characteristics may be combined in any suitable manner in one or more embodiments.

A method is disclosed for forming a regular array of vertical bipolar junction transistors. A regular array of base contact pillars and emitter contact pillars are formed with a lithographic technique having a minimum lithographical resolution F. Double patterning techniques can be performed to form the base contact pillars and emitter contact pillars having a width below the minimum lithographical resolution F. In an embodiment, the pillar array features have a dimension of approximately F/2, though this dimension could be reduced down to other values compatible with embodiments of the invention. The regular array of base contact pillars and emitter contact pillars can be defined by a first set of parallel trenches in a first direction and a second set of parallel trenches in a second direction perpendicular to the first direction. A storage element, such as a phase change storage element, can be formed above the regular array of base contact pillars and emitter contact pillars.

FIG. 1A-FIG. 1C illustrate a top view, side view Y-array (i.e., the array viewed in the Y direction which will become the bit-line BL'-BL" of FIG. 1A), and side view X-array (i.e., the array viewed in the X direction which will become the word-line WL'-WL" of FIG. 1A) of a regular array of pillars with dual shallow trench isolation in accordance with embodiments of the present invention. A semiconductor substrate is doped by a p-type collector implant to form a p-type collector (common) 12 under a shallower base implant that forms an n-type base (word-line) 14 including upper part 14a and lower part 14b. The base implant may be antimony and arsenic in one embodiment. The collector implant may be boron in one embodiment.

A plurality of emitter pillars 16 may be arranged in four columns, each column extending in the Y-direction, in one embodiment. Each set of four columns of emitter pillars 16 is separated by a set of two base electrodes or contact pillars 18. Thus, a Y-direction column of base contact pillars 18 is followed in the X-direction by four columns of emitter pillars 16, each column extending in the Y direction, followed by another column of base contact pillars 18, and this pattern repeats.

Each row of emitter pillars 16 is separated from an adjacent row by shallow trench isolation 22. Likewise, each column of emitter pillars 16 is separated from adjacent emitter pillars 16 in the X-direction by shallow trench isolation 20. In this embodiment the depth of the shallow trench isolation 20 may range between 50 nm and 200 nm and so it may be much shallower than the shallow trench isolations 22, whose depth may range between 200 nm and 500 nm.

The deeper shallow trench isolations 22 may extend all the way into (or alternatively to the top of) the p-type collector 12 while the shallow trench isolations 20 may extend only into the n-type base or word-line 14, in one embodiment. Thus, the n-type base or word-line 14 is made up of a lower part 14b which is below the shallow trench isolation 20, and an upper part 14a which is above the bottom of shallow trench isolation 20.

In one embodiment, the base contact pillars 18 have n+ base contacts 54, the emitter pillars 16 are p-type with p+ emitter contacts 56, and the word-line is n-type. However, the polarities may also be reversed in some cases. In addition, the number of columns of emitter pillars 16 between base contact emitter pillars 18 may be more or less than four.

As a result, a bipolar junction transistor is formed with emitter pillars 16, base contact pillars 18, bases or word-lines 14, and collector 12. The collector 12 is common to all the transistors. The word-line or base 14 is common to each row in the X-direction. Individual transistors are formed by the segmented emitter pillars 16 and segmented base contact pillars 18.

FIG. 2-FIG. 23 are illustrations of an embodiment for fabricating the structure shown in FIG. 1A-FIG. 1C. While the embodiment illustrates the formation of a first set of parallel trenches with a first depth and in a first direction, and a second set of parallel trenches with a second depth and in a second direction perpendicular to the first direction, embodiments of the invention are not so limited and the order of forming the trenches can be reversed. Furthermore, it is to be appreciated that doping of the base contact pillars and emitter contact pillars can be performed at various stages, such as before, during, and/or after the process illustrated in FIG. 2-FIG. 23.

FIG. 2 is a side view illustration of the layers used for patterning. As shown, the layers include a substrate 10, dielectric layer 24, etch stop layer 26, and fin patterning layer 28. In an embodiment, substrate 10 is a silicon substrate, though other known semiconductor materials can be used. In an embodiment, the substrate 10 may be doped with a p-type collector implant to form the p-type collector (common) 12 under a shallower base implant that forms the n-type base (word-line) lower part 14b. The base implant may be antimony and/or arsenic in one embodiment. The collector implant may be boron in one embodiment.

Referring again to FIG. 1B, the n-type dopant forming the word-line 14 does not extend beyond the shallow trench isolation regions 22, which may be 200-500 nm deep, separating each row of emitter pillars 16. Stated differently, when shallow trench isolation regions 22 are formed, they extend in the array all the way through the n-base or word-line 14 into the underlying p-type collector 12. In an embodiment, dielectric layer 24 is an oxide 5-10 nm thick, and etch stop layer 26 is a nitride 40-60 nm thick. In an embodiment, the fin patterning layer 28 is an approximately 160 nm thick polysilicon layer. The polysilicon may be amorphous or undoped, as two examples. However, fin patterning layer 26 is not limited to polysilicon, and can be any material, such as a dielectric or photoresist, which can be selectively removed relative to the etch stop layer 26.

Figure 3:
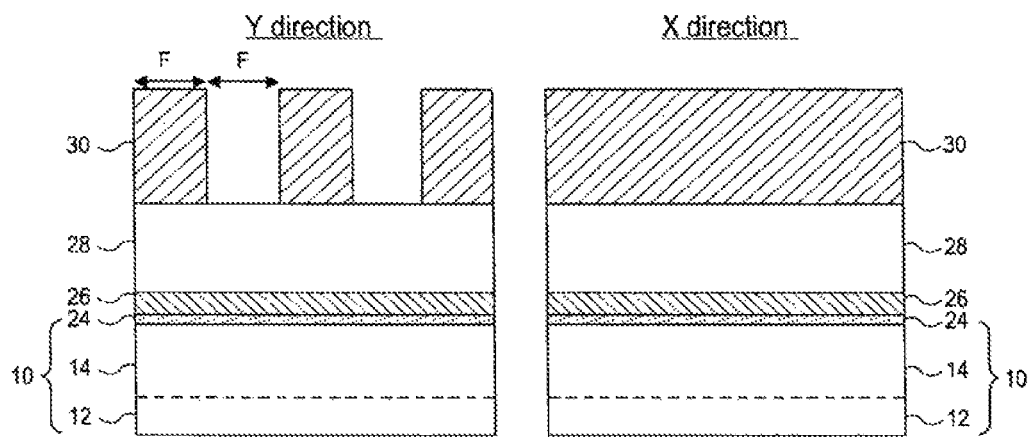

Then, as illustrated in FIG. 3, the first shallow trench isolation mask is exposed to define horizontal strips of active area. The exposure resolves the minimum lithographical dimension F. A masking layer 30 such as photoresist or suitable hard-mask is patterned in strips with the minimum lithographical dimension F.

Figure 4:
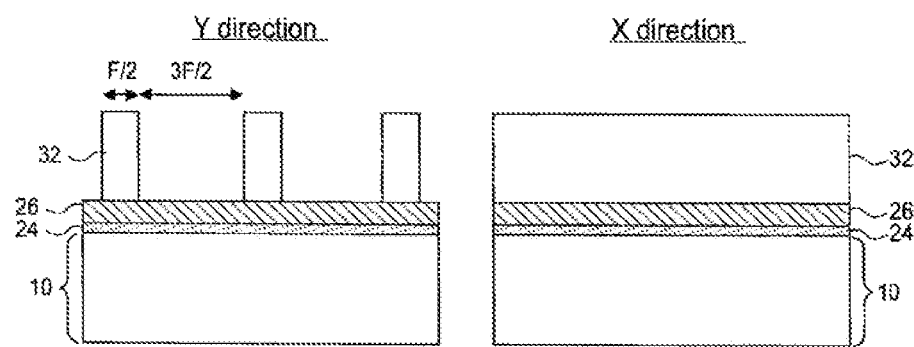

The fin patterning layer 28 is then patterned as illustrated in FIG. 4 to form fins 32. The fins 32 are etched utilizing a partially isotropic etching technique such that the dimensions are reduced to approximately F/2. This dimension will not determine the width of the Y-direction active area strips, but only their spacing, as further described.

Figure 5:
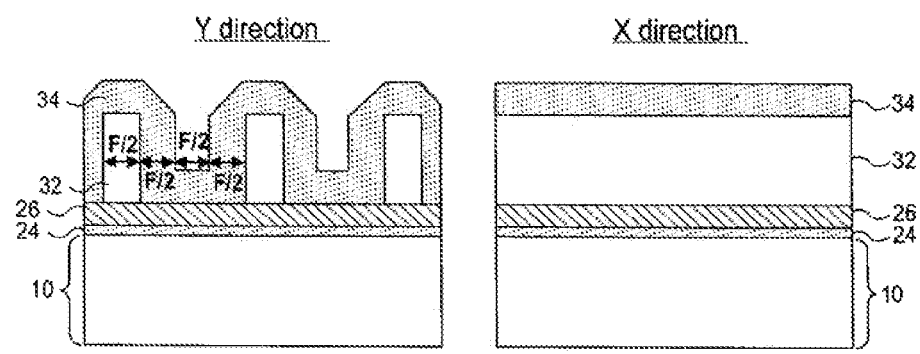
Figure 6:
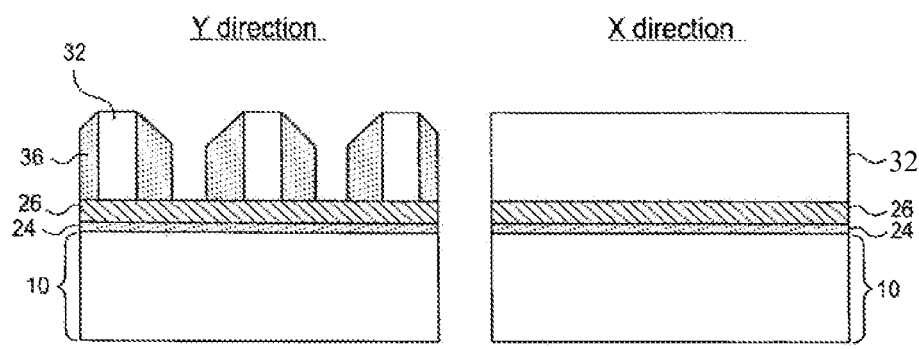
Figure 7:
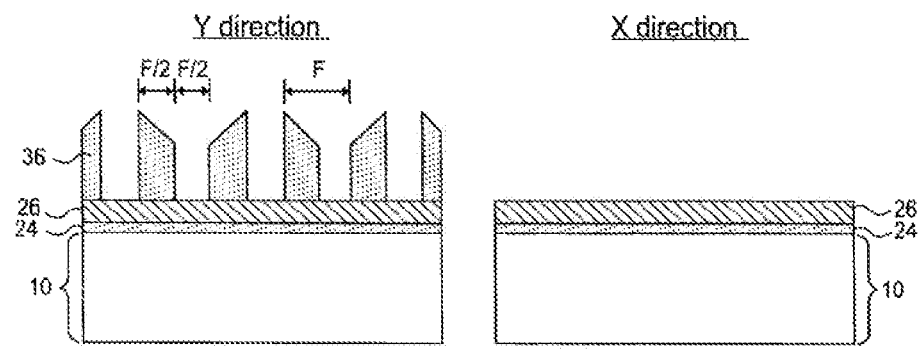

A conformal layer 34 is then deposited over the fins 32, as illustrated in FIG. 5. The conformal layer 34 may be silicon oxide, for example. In an embodiment, the conformal layer 34 has a thickness of F/2 on the sidewalls of fins 32 and the distance between the conformal layer 34 on the sidewalls of adjacent fins 32 is also F/2. The conformal layer 34 is then anisotropically etched back as shown in FIG. 6, and the fins 32 are selectively removed as shown in FIG. 7 leaving a regular grid of spacers 36 having a controlled width of F/2. The regular grid of spacers 36 are separated by a distance of F/2 and have a pitch of F. In a particular embodiment, F is approximately 60 nm when utilizing 193 nm lithographic wavelength and immersion lithography techniques. Though, this dimension could be reduced down to any value compatible with thickness control of the conformal layer 34 and spacers 36. The final pitch will not go below F, being definitely linked to the minimal lithographical dimension (i.e. to the minimum lithographical half-pitch).

Figure 8:
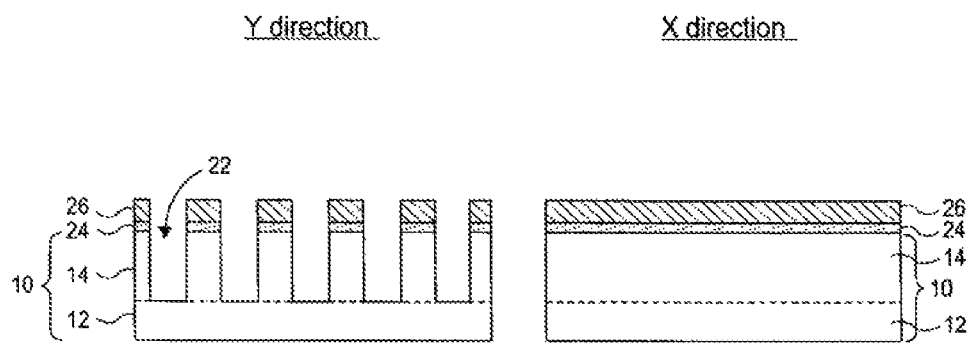

Spacers 36 are then used as a hard mask to define Y-direction active area strips with sub-lithographical dimensions. As shown in FIG. 8, spacers 36 are used as a hard mask to anisotropically etch the underlying etch stop layer 26, dielectric layer 24, and substrate 10 to form shallow trench isolations 22 which in turn define the Y-direction active area strips. In an embodiment, shallow trench isolations 22 are etched approximately 200-500 nm deep into the substrate 10. In an embodiment, shallow trench isolations 22 are etched to a depth of approximately 270 nm from the top surface of the substrate 10. In an embodiment, where word-line 14 and/or collector 12 doping has already been performed, shallow trench isolations 22 are etched all the way through the n-base or word-line 14 and into (or alternatively to the top of) the underlying p-type collector 12. Spacers 36 may then be selectively removed, though complete removal is not necessary to the practice of embodiments of the invention. The regular array of base contact pillars and emitter contact pillars which will subsequently be formed are partially defined by the first set of parallel shallow trench isolations 22 in the Y-direction.

Figure 9:
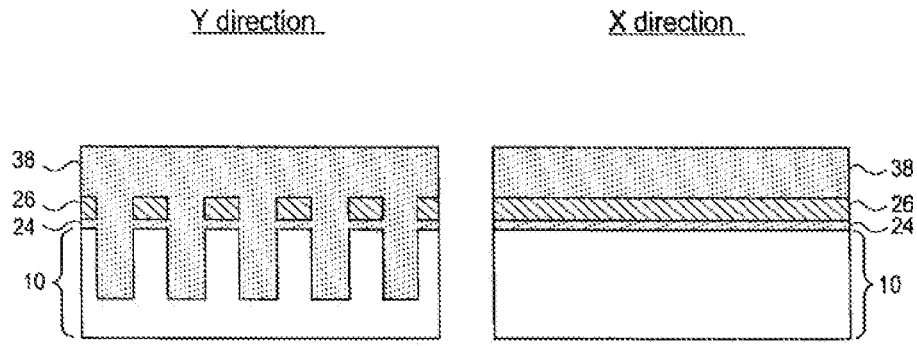

Referring now to FIG. 9, a dielectric layer 38 is blanket deposited over the substrate, filling the shallow trench isolations 22 and covering the top surface of the patterned etch stop layer 26. In an embodiment, dielectric layer 38 is the same material as conformal layer 34. For example, both layers may be silicon oxide. A particular benefit of utilizing the same material for both dielectric layer 38 and conformal layer 34 is that any residual spacer 36 material not removed after etching shallow trench isolations 22 is now included in dielectric layer 38 on top of etch stop layer 26.

Figure 10:
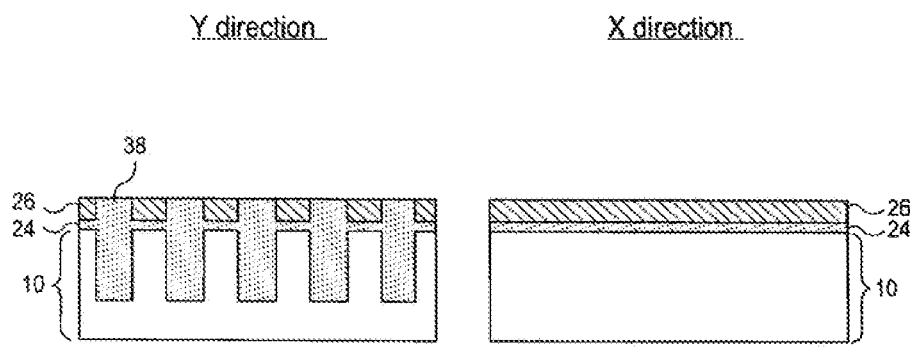

Chemical mechanical polishing (CMP) is then performed to remove dielectric layer 38 on top of patterned etch stop layer 26, forming a planar surface as shown in FIG. 10. In particular, the etch stop layer 26 performs a dual function. Firstly, etch stop layer 26 assists in the etching process of fin patterning layer 28 to form fins 32, and additionally functions as a physical stopping layer during CMP. However, as will become apparent, the presence of the patterned etch stop layer 26 could potentially be problematic during subsequent lithographical processes because the presence of multiple different materials on the top surface of the substrate can cause wave reflection which is particularly detrimental to sub-lithographical resolution in embodiments of the present invention.

Moreover the etch stop layer 26 could represent a discontinuity during etching of the shallow trench 20, because it would be present only on half of the exposed area. Thus, the etch stop layer 26 is removed.

Figure 11:
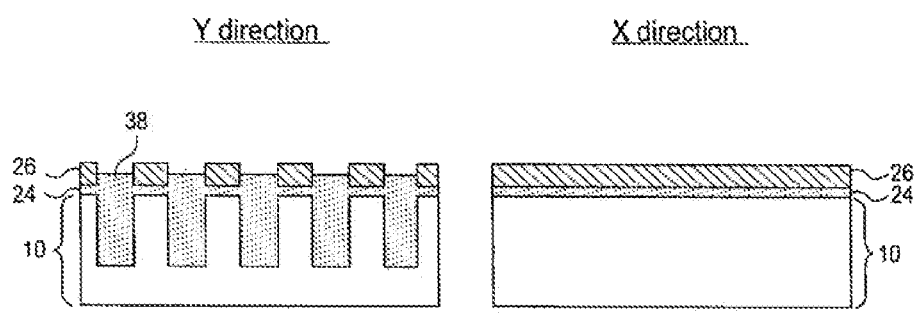
Figure 12:
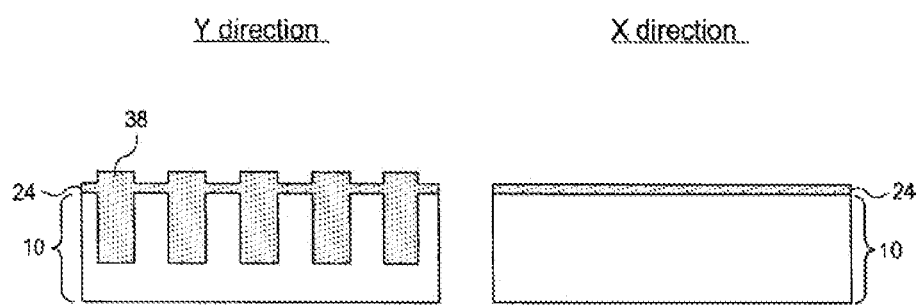

As shown in FIG. 11, prior to removal of patterned etch stop layer 26, the dielectric material 38 within the patterned etch stop layer 26 is partially removed, for example by selective wet etch with a buffered HF solution. Then, as shown in FIG. 12, the patterned etch stop layer 26 is selectively removed leaving surface topography including a top surface of dielectric material 38 that is approximately planar with the top surface of dielectric layer 24. In an embodiment, the top surface of dielectric material 38 is above or even with the top surface of dielectric layer 24, but is not below the top surface of dielectric layer 24. In an embodiment, dielectric material 38 is removed with regard to at least 80% of the original etch stop layer 26 thickness. For example, where original etch stop layer is approximately 50 nm thick, approximately 40 nm of dielectric material 38 is removed so that the top surface of dielectric material 38 is approximately 10 nm or less above the top surface of dielectric layer 24. In accordance with embodiments of the invention, the surface topography is not chemical mechanical polished at this point because an etch stop layer is not present to control removal.

In one embodiment, the substrate 10 is not already doped for the collector and/or base. In such an embodiment, the substrate 10 including the Y-direction active area strips can be doped by a p-type collector implant to form a p-type collector (common) 12 under a shallower base implant that forms an n-type base (word-line) 14. The base implant may be antimony and arsenic in one embodiment. The collector implant may be boron in one embodiment.

Figure 13:
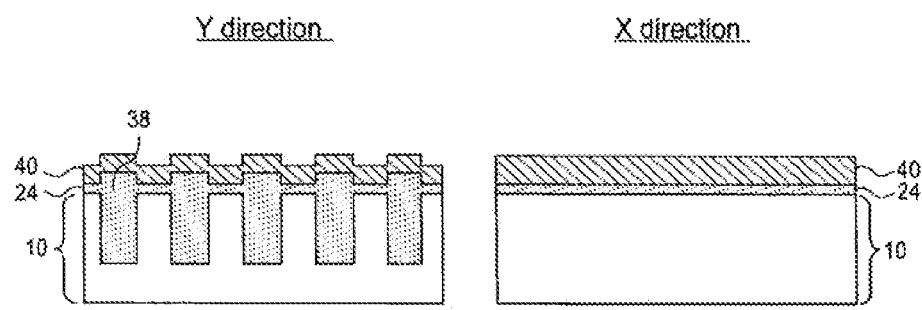
Figure 14:
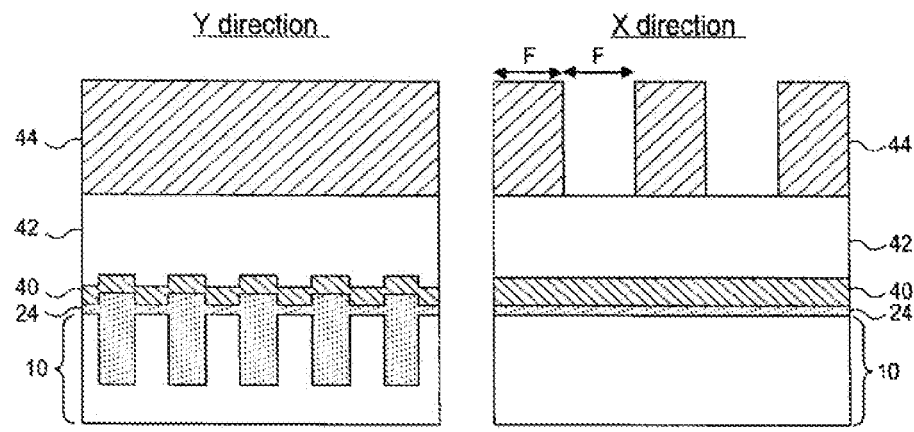

Then, as illustrated in FIG. 13 and FIG. 14, another etch stop layer 40 is deposited over the top surface of dielectric material 38 and dielectric layer 24, followed by a fin patterning layer 42, and masking layer 44. Layers 40, 42 and 44 can be the same materials as layers 26, 28 and 30, respectively. As shown in FIG. 14, the lithographical exposure of masking layer 44 is rotated by 90 degrees with respect to the exposure of masking layer 30 and the previous procedure is repeated. The exposure resolves the minimum lithographical dimension F in masking layer 44.

Figure 15:
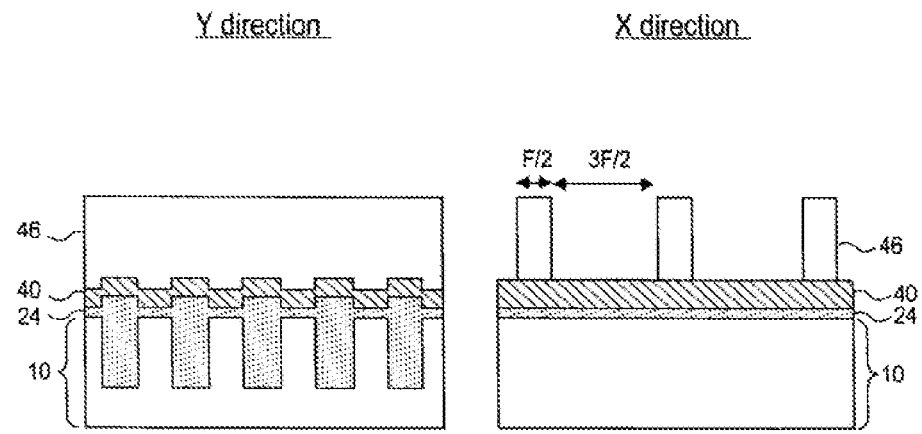

As illustrated in FIG. 15, the fin patterning layer 42 is then patterned to form fins 46. The fins 46 are etched utilizing an isotropic etching technique such that the dimensions are reduced to approximately F/2. This dimension will not determine the width of the active areas (pillars), but only their spacing, as further described.

Figure 16:
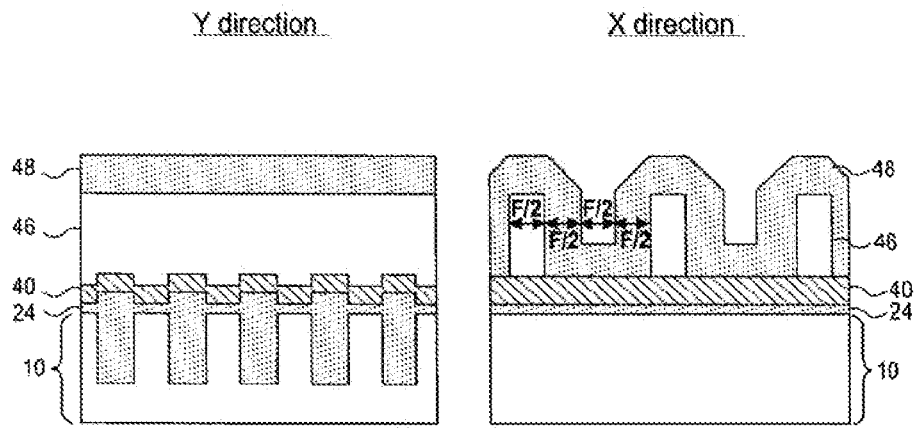
Figure 17:
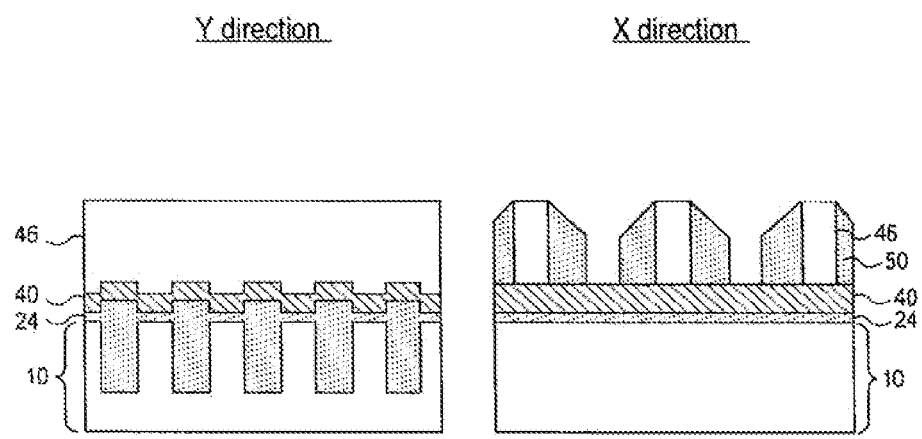
Figure 18:
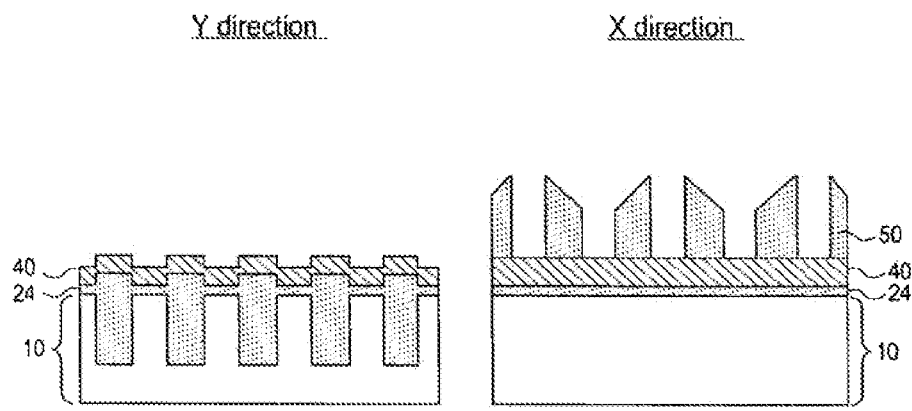

A conformal layer 48 is then deposited over the fins 46, as illustrated in FIG. 16. The conformal layer 48 may be silicon oxide, for example. In an embodiment, the conformal layer 48 has a thickness of F/2 on the sidewalls of fins 46 and the distance between the conformal layer 48 on the sidewalls of adjacent fins 46 is also F/2. The conformal layer 48 is then anisotropically etched back as shown in FIG. 17, and the fins 46 are selectively removed as shown in FIG. 18 leaving a regular grid of spacers 50 having a controlled width of F/2. The regular grid of spacers 50 are separated by a distance of F/2 and have a pitch of F. In a particular embodiment, F is approximately 60 nm when utilizing 193 nm lithographic wavelength and immersion lithography techniques. Though, this dimension could be reduced down to any value compatible with thickness control of the conformal layer 48 and spacers 50. The final pitch will not go below F, being definitely linked to the minimal lithographical dimension (i.e. to the minimum lithographical half-pitch).

Figure 19:
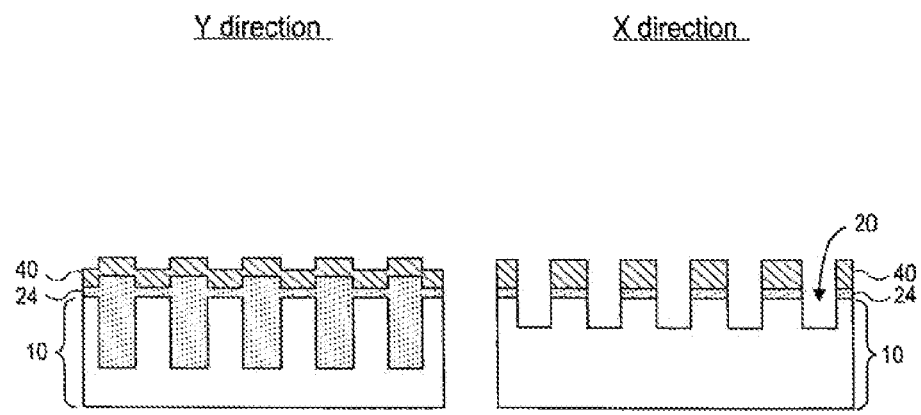

Spacers 50 are then used as a hard mask to define the X-direction active area strips with sub-lithographical dimensions. The X-direction active area strips intersect the Y-direction active area strips to form the regular array of active area pillars with sub-lithographical dimensions in accordance with embodiments of the present invention. As shown in FIG. 19, spacers 50 are used as a hard mask to anisotropically etch the underlying etch stop layer 40, dielectric layer 24, and substrate 10 to form shallow trench isolations 20. In an embodiment, shallow trench isolations 20 are etched approximately 50-200 nm deep into the substrate 10. Spacers 50 may then be selectively removed, though complete removal is not necessary to the practice of embodiments of the invention.

Figure 20:
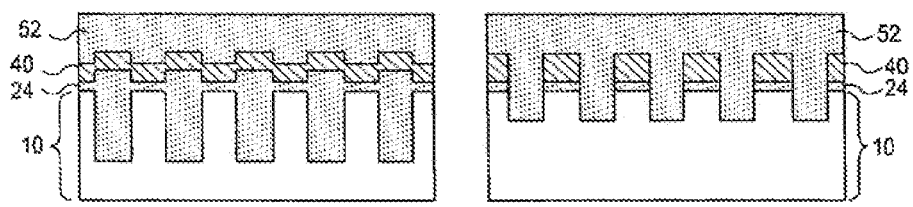

Referring now to FIG. 20, a dielectric layer 52 is blanket deposited over the substrate filling the shallow trench isolations 20 and covering the top surface of the patterned etch stop layer 40. In an embodiment, dielectric layer 52 is the same material as conformal layer 48. For example, both layers may be silicon oxide. A particular benefit of utilizing the same material for both dielectric layer 52 and conformal layer 48 is that any residual spacer 50 material not removed after etching shallow trench isolations 20 is now included in dielectric layer 52 on top of etch stop layer 40.

Figure 21:
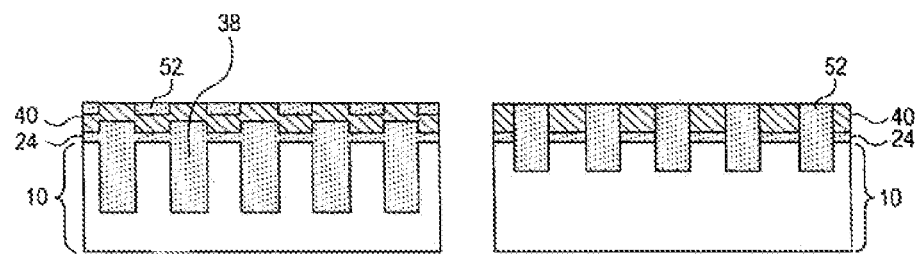
Figure 23:
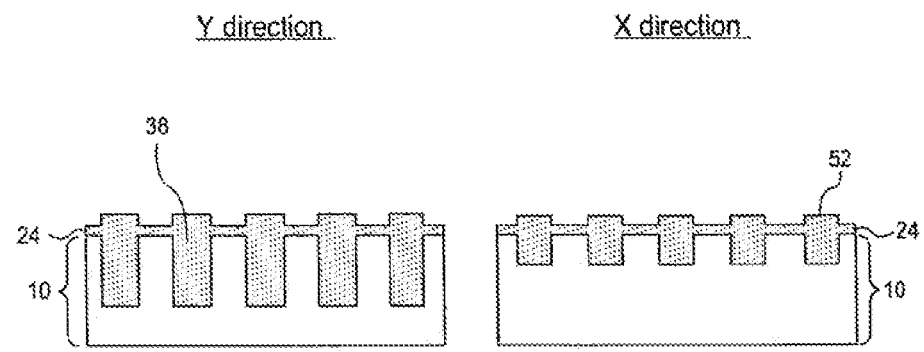

Chemical mechanical polishing (CMP) is then performed to remove dielectric layer 52 on top of patterned etch stop layer 40, forming a planar surface as shown in FIG. 21. In particular, the patterned etch stop layer 40 performs a dual function. Firstly, etch stop layer 40 assists in the etching process of fin patterning layer 42 to form fins 46, and additionally functions as a physical stopping layer during CMP. Etch stop layer 40 is subsequently removed as illustrated in FIG. 23.

Figure 22:
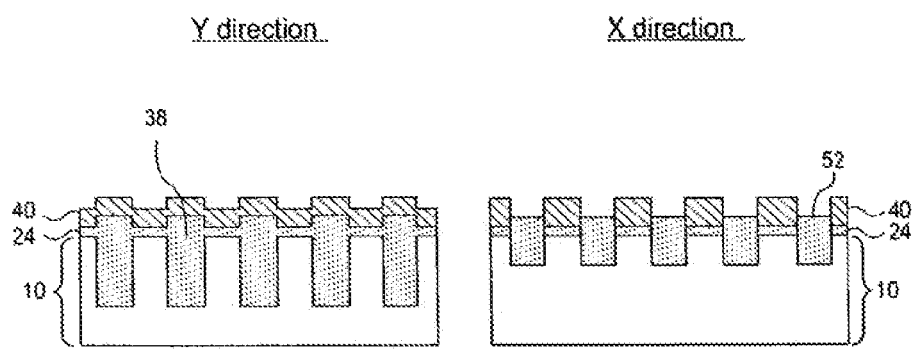

Prior to removal of patterned etch stop layer 40, as shown in FIG. 22, the dielectric material 52 within the patterned etch stop layer 40 is partially removed, for example by selective wet etch with a buffered HF solution. Then, as shown in FIG. 23, the patterned etch stop layer 40 is selectively removed leaving surface topography including a top surface of dielectric material 52 that is approximately planar with the top surface of dielectric layers 24 and 38. In an embodiment, the top surface of dielectric material 52 is above or even with the top surface of dielectric layer 24, but is not below the top surface of dielectric layer 24. In an embodiment, dielectric material 52 is removed with regard to at least 80% of the original etch stop layer 40 thickness. For example, where original etch stop layer is approximately 50 nm thick, approximately 40 nm of dielectric material 52 is removed so that the top surface of dielectric material 52 is approximately 10 nm or less above the top surface of dielectric layer 24. In accordance with embodiments of the invention, the surface topography is not chemical mechanical polished at this point because an etch stop layer is not present to control removal.

In one embodiment, the substrate 10 is not already doped for the collector and/or base. In such an embodiment, the substrate 10 including the partially completed structure can be doped by a p-type collector implant to form a p-type collector (common) 12 under a shallower base implant that forms an n-type base (word-line) 14. The base implant may be antimony and arsenic in one embodiment. The collector implant may be boron in one embodiment. In an embodiment, the emitter pillars 16 are now doped with a p-type dopant to form p+ emitter contacts 56. In an embodiment the base pillars 18 are now doped with an n-type implant to form the n+ base contacts 54.

The regular array of pillars with planar dimensions F/2× F/2 and a pitch F is illustrated in FIG. 1. As previously described, implants and thermal treatments could be performed in order to create the vertical pnp BJTs at several times during processing such as with the original substrate provided in FIG. 2, after the etch stop layer 26 removal in FIG. 12, and after the etch stop layer 40 removal in FIG. 23. Likewise, implant and thermal treatments can be performed in a combination of the above mentioned periods. In an embodiment, collector 12 p-doping and word-line 14 n-doping is performed in the original substrate prior to FIG. 2, while p+ emitter contact 56 doping and n+ base contact 54 doping are performed after etch stop layer 26 removal in FIG. 23. After all implants and activation have been completed, the top of all pillars, both base contacts 18 and emitter 16, may be silicided (e.g. with Titanium, Cobalt or Nickel)."

FIG. 24A-FIG. 24C are illustrations of a contact plug 83 landing on the base contact pillars 18. In an embodiment, contact plug 83 landing is made with two base contact pillars 18, which gives a workable margin for landing since the base contact pillars 18 are below lithographic resolution. As shown, base contact plugs 83 contact two base contact pillars 18. While the base contact plugs 83 are illustrates as rectangles, in fabrication the lithographic resolution can make them elliptical. The contacting scheme is peculiar to embodiments of the present invention as an elongated contact is needed to satisfy lithographic requirements and two base contact pillars 18 are needed to preserve the regularity of the pillar array and to guarantee margins for relative registration of these contacts to the underlying active areas.

In an embodiment, the string is made of four emitter pillars and two base contact pillars, though the string can also be made of $2^n$ emitter pillars (n is an integer>0) or any other positive number of emitter pillars. In an embodiment, the pillar array features have a dimension of approximately F/2, though this dimension could be reduced down to any value compatible with thickness control of the conformal layers 34, 48 and spacers 36, 50. The final pitch will not go below F, being definitely linked to the minimal lithographical dimension (i.e. to the minimum lithographical half-pitch).

In one embodiment, a non-volatile storage element array may be formed over the bipolar junction transistors that act as selection devices for each storage element array. The structure illustrated in FIG. 24A-FIG. 24C does not illustrate a storage element, such as phase change memory (PCM), phase-change random access memory (PRAM or PCRAM), ovonic unified memory (UOM) or chalcogenide random access memory (C-RAM), though such, a storage element can be below or above the word-line 82.

Figure 25:
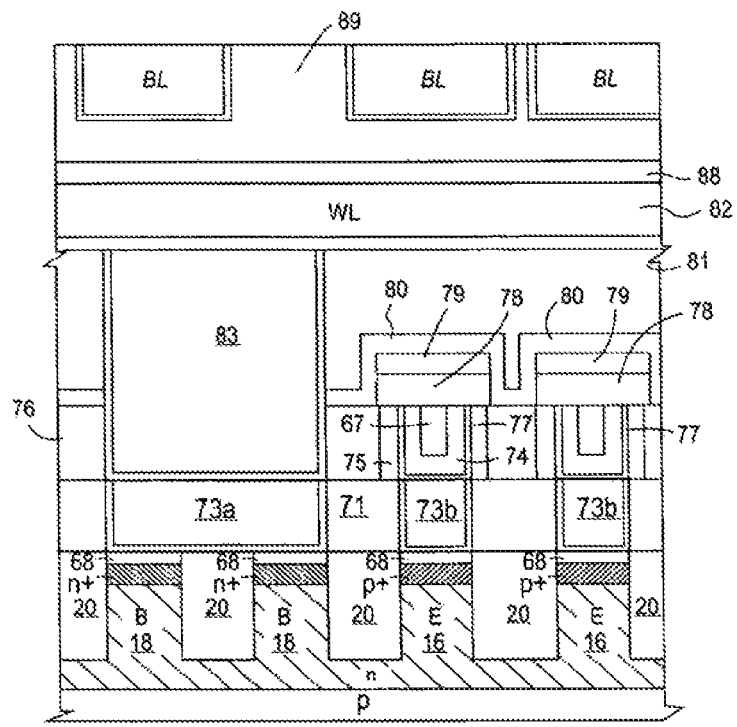
FIG. 25 is a side view illustration of a storage element placed below a word line.

FIG. 25 is an illustration of an embodiment in which a storage element is placed below the word-line 82. Base contact pillars 18 and the emitter contact pillars 16 separated by shallow trench isolations 20 may be covered with a first dielectric layer 71 that may be undoped silicon glass with a thickness of 700 nm, which is deposited and planarized down to 600 nm, in one embodiment.

Thereafter, the first dielectric layer 71 and optional first nitride layer are etched where contacts may be formed so as to form openings that reach the silicide region 68. The apertures may be filled with a barrier layer such as multiple titanium/ titanium nitride layers (not shown), and by a tungsten layer (not shown), and the deposited layers may be planarized to form first level plugs 73a and 73b. The first level plugs 73a are in contact with the base contact pillars 18, and the first level plugs 73b are in electrical contact with the emitter contact pillars 16.

Then, a second dielectric layer 76 is deposited. Openings are formed in the second dielectric layer 76 above the emitter contact pillars 16. A spacer layer 75 of silicon nitride is formed on the walls of the openings, using deposition and subsequent etch-back. Heater layer 77 and a sheath layer 74 may be subsequently deposited to cover the walls and the bottom of the openings. A third dielectric layer 67 may be deposited to fill the openings. The wafer is planarized in one embodiment. Accordingly, the heaters 77 may generally be cup-shaped. The heaters 77 extend on a first level plug 73b which is in electric contact with the emitter contact pillars 16.

Next, a chalcogenide layer 78, which may be GST ($Ge_2Sb_2Te_5$), and a metal layer 79 are deposited and defined to form resistive bit-lines, which run perpendicularly to the plane and the sheet. Metal lines 79 then create a first metal level.

Then, a sealing level 80 and a fourth dielectric layer 81 may be deposited. Holes are opened, coated with a barrier layer, and filled by a metal layer 83 of copper in one embodiment.

Then, word-lines 82 from the second metal layer are formed on the fourth dielectric layer 81 in electrical contact with the second level, base plugs 83, and thus the base regions, through the first level plugs 73a on the base contacts 18. A third nitride layer 88 may be joined over the word-lines 82.

The bit-lines BL may be formed in the sixth dielectric layer 89 from a third metal layer.

Programming to alter the state or phase of the material may be accomplished by applying voltage potentials to the heater 77 and the metal layer 79, thereby generating a voltage potential across a memory element including the chalcogenide layer 78. When the voltage potential is greater than the threshold voltages of any select device and memory element, then an electrical current may flow through the phase change layer 26 in response to the applied voltage potentials, and may result in heating of the chalcogenide layer 78.

This heating may alter the memory state or phase of the layer 78, in one embodiment. Altering the phase or state of the phase change layer 78 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 26:
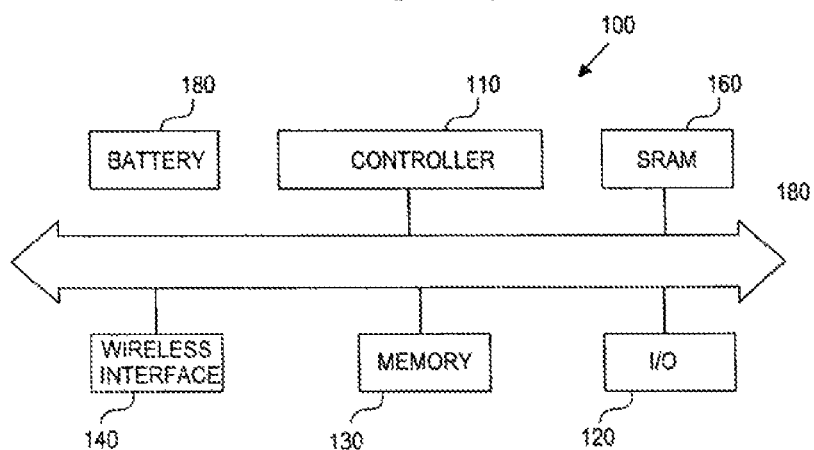
FIG. 26 is an illustration of a system in accordance with an embodiment.

Turning to FIG. 26, a portion of a system 100 in accordance with an embodiment of the present invention is described. System 100 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 100 may be used in any of the following systems: a wireless local area network (WLAN) system, a wireless personal area network (WPAN) system, a cellular network, although the scope of the present invention is not limited in this respect.

System 100 may include a controller 110, an input/output (I/O) device 120 (e.g. a keypad, display), static random access memory (SRAM) 160, a memory 130, and a wireless interface 140 coupled to each other via a bus 150. A battery 180 may be used in some embodiments. It should be noted that the scope of the present invention is not limited to embodiments having any or all of these components.

Controller 110 may comprise, for example, one or more microprocessors, digital signal processors, microcontrollers, or the like. Memory 130 may be used to store messages transmitted to or by system 100. Memory 130 may also optionally be used to store instructions that are executed by controller 110 during the operation of system 100, and may be used to store user data. Memory 130 may be provided by one or more different types of memory. For example, memory 130 may comprise any type of random access memory, a volatile memory, a non-volatile memory such as a flash memory and/or a memory discussed herein.

I/O device 120 may be used by a user to generate a message. System 100 may use wireless interface 140 to transmit and receive messages to and from a wireless communication network with a radio frequency (RF) signal. Examples of wireless interface 140 may include an antenna or a wireless transceiver, although the scope of the present invention is not limited in this respect.

In the foregoing specification, various embodiments of the invention have been described. It will, however, be evident that various modifications and changes may be made thereto without departing from the broader spirit and scope of the invention as set forth in the appended claims. The specification and drawings are, accordingly, to be regarded in an illustrative sense rather than a restrictive sense. It is intended that the appended claims cover all such modifications and variations as fall within the true spirit and scope of the present invention.

What is claimed is:

1. A method of fabricating an array of vertical bipolar junction transistors, the method comprising:
    forming an array of base contact pillars and an array of emitter contact pillars with a lithographic technique having a minimum lithographical resolution F, the base contact pillars and the emitter contact pillars each having a width below the minimum lithographical resolution F, the forming of the array of base contact pillars and the array of the emitter contact pillars including forming a first set of shallow trench isolation regions extending at least to a first doped region and forming a second set of shallow trench isolation regions which do not extend to the first doped region, the first doped region being a common collector, the second set of shallow trench isolation regions being formed substantially perpendicular to the first set of shallow trench isolation regions; and
    forming a storage element above the array of base contact pillars and the array of emitter contact pillars.

2. The method of claim 1, further comprising forming a first level base contact plug in electrical contact with a plurality of base contact pillars.

3. The method of claim 1, wherein the base contact pillars and emitter contact pillars have a width of F/2.

4. The method of claim 1, wherein the first doped region comprises a p-type material.

5. The method of claim 1, wherein forming the array of base contact pillars and the array of emitter contact pillars comprises a first double patterning technique and a second double patterning technique.

6. The method of claim 5, wherein the first double patterning technique and the second double patterning technique comprise:
    partially removing a dielectric material from between a patterned etch stop layer after filling a shallow trench isolation with the dielectric material; and
    removing the patterned etch stop layer after partially removing the dielectric material from between the patterned etch stop layer.

7. The method of claim 5, wherein the first double patterning technique includes:
    forming a first dielectric layer, a first etch stop layer, and a first fin patterning layer over a substrate;
    lithographically patterning the fin patterning layer with an array of first strips having a width approximately equal to a minimum lithographical resolution F;
    forming an array of first fins having a width of approximately F/2;
    depositing a conformal layer over the fins, the conformal layer having a thickness of approximately F/2 on the sidewalls of the fins;
    anisotropically etching back the fins;
    selectively removing the fins; and
    etching through the first etch stop layer and first dielectric layer, and into the substrate to form a first set of shallow trench isolation regions which define first-direction active area strips, a patterned first dielectric layer, and patterned first etch stop layer.

8. The method of claim 7, further comprising:
    depositing a second dielectric layer over the substrate filling the first set of shallow trench isolation regions and covering the top surface of the patterned etch stop layer;
    removing the second dielectric layer on top of the patterned etch stop layer;
    partially removing the second dielectric layer between patterned etch stop layer; and
    selectively removing the patterned etch stop layer.

9. The method of claim 8, wherein partially removing the second dielectric layer between the patterned etch stop layer comprises removing a thickness corresponding to at least 80% of the original thickness of the patterned etch stop layer.

10. The method of claim 8, further comprising:
    forming a second etch stop layer and a second fin patterning layer over the substrate;
    lithographically pattering the second fin patterning layer with an array of second strips having a width approximately equal to a minimum lithographical resolution F;
    forming an array of second fins having a width of approximately F/2;
    depositing a second conformal layer over the second fins, the second conformal layer having a thickness of approximately F/2 on the sidewalls of the second fins;
    anisotropically etching back the second fins;
    selectively removing the second fins; and
    etching through the second etch stop layer and first dielectric layer, and into the substrate to form a second set of shallow trench isolation regions defining second-direction active area strips perpendicular to the first-direction active area strips, a patterned first dielectric layer, and patterned second etch stop layer.

11. The method of claim 10, further comprising:
depositing a third dielectric layer over the substrate filling the second set of shallow trench isolation regions and covering the top surface of the patterned second etch stop layer;
removing the third dielectric layer on top of the patterned second etch stop layer;
partially removing the third dielectric layer between patterned second etch stop layer; and
selectively removing the patterned second etch stop layer.

12. The method of claim 10, further comprising:
forming a p+ dopant into to the pillars which will become p+ emitter contacts; and
forming an n+ dopant into the pillars which will become n+ base contacts.

13. A method of fabricating an electronic device, the method comprising:
forming an array of base contact pillars and an array of emitter contact pillars with a lithographic technique having a minimum lithographical resolution F, the base contact pillars and the emitter contact pillars each having a width below the minimum lithographical resolution F, the forming of the array of base contact pillars and the array of the emitter contact pillars including a double-patterning technique comprising forming a first set of shallow trench isolation regions extending at least to a first doped region and forming a second set of shallow trench isolation regions which do not extend to the first doped region, the double-patterning technique including
   partially removing a dielectric material from between a patterned etch stop layer after filling each set of shallow trench isolation regions with the dielectric material; and
   removing the patterned etch stop layer after partially removing the dielectric material from between the patterned etch stop layer; and
forming a storage element above the array of base contact pillars and the array of emitter contact pillars.

14. A method of fabricating an array of vertical bipolar junction transistors, the method comprising:
forming an array of base contact pillars and an array of emitter contact pillars with a lithographic technique having a minimum lithographical resolution F, the base contact pillars and the emitter contact pillars each having a width below the minimum lithographical resolution F, the forming of the array of base contact pillars and the array of the emitter contact pillars including forming a first set of shallow trench isolation regions extending at least to a first doped region and forming a second set of shallow trench isolation regions which do not extend to the first doped region, the forming of the array of base contact pillars and the array of emitter contact pillars comprises a first double patterning technique and a second double patterning technique, the first double patterning technique and the second double patterning technique comprise:
   partially removing a dielectric material from between a patterned etch stop layer after filling a shallow trench isolation with the dielectric material; and
   removing the patterned etch stop layer after partially removing the dielectric material from between the patterned etch stop layer; and
forming a storage element above the array of base contact pillars and the array of emitter contact pillars.

* * * * *